United States Patent
Zhang et al.

(10) Patent No.: US 11,881,871 B1
(45) Date of Patent: Jan. 23, 2024

(54) ON-THE-FLY SCALING FACTOR CHANGE FOR IRREGULAR LDPC CODES

(71) Applicant: SK hynix Inc., Gyeonggi-do (KR)

(72) Inventors: Fan Zhang, Fremont, CA (US); Haobo Wang, San Jose, CA (US); Meysam Asadi, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/944,837

(22) Filed: Sep. 14, 2022

(51) Int. Cl.
  *H03M 13/00* (2006.01)
  *H03M 13/11* (2006.01)

(52) U.S. Cl.
  CPC ........ *H03M 13/118* (2013.01); *H03M 13/611* (2013.01)

(58) Field of Classification Search
  None
  See application file for complete search history.

(56) References Cited

U.S. PATENT DOCUMENTS

| | | | |
|---|---|---|---|
| 7,337,384 B2 | 2/2008 | Lakaniemi | |
| 7,831,895 B2* | 11/2010 | Lin | H03M 13/1111 714/800 |
| 10,700,706 B2 | 6/2020 | Zhang et al. | |
| 11,184,024 B2 | 11/2021 | Xiong et al. | |
| 2008/0028274 A1* | 1/2008 | Lin | H03M 13/1111 714/752 |
| 2008/0126908 A1* | 5/2008 | Lin | H03M 13/1108 714/E11.032 |
| 2013/0055050 A1* | 2/2013 | Uchikawa | H03M 13/116 714/781 |
| 2021/0184699 A1* | 6/2021 | Kwak | H03M 13/1575 |
| 2021/0184795 A1* | 6/2021 | Ibars Casas | H03M 13/6561 |
| 2021/0383220 A1* | 12/2021 | Beery | H03M 13/6597 |
| 2022/0058081 A1* | 2/2022 | Lee | G06F 11/1008 |

\* cited by examiner

*Primary Examiner* — Mujtaba M Chaudry
(74) *Attorney, Agent, or Firm* — IP & T GROUP LLP (57) ABSTRACT

Decoding method and memory system that decodes data and estimates a weighted checksum on the decoded data to determine whether the decoding is successful. The weighted checksum is calculated based on a first group and a second group, the first group is associated with weights for high degree nodes of an irregular parity check matrix, and the second group is associated with weights for low degree nodes of the irregular parity check matrix.

20 Claims, 8 Drawing Sheets

OSFC (on-the-fly scaling factor change)

$$L_{v2c} = \left(\frac{L_{ch}}{\alpha_1} + \sum L_{c2v}\right)\alpha_2$$

← Pseudo code 72

- Programmable parameters:
  - MS hard: (Initial LLR, $\alpha_2$, $\beta$, maxiter)
  - MS soft: ($\alpha_2$, $\beta$, maxiter)
- $\alpha_2 \in [0.5, 0.5625, 0.625, 0.75]$
- $\beta \in [1,2,4]$
- OSFC scheme changes $\alpha_1$ during one decoding session based on the checksum value:

```
For iter=0:maxiter-1
    if (checksum < T_cs2 && iter > 0)
        α_1 = β,
    else
        α_1 = α_2
```

← Iterative convergence algorithm 74

FIG. 9

Constrained H 900

|  | high | mid-low |
|---|---|---|
| s_high | H11 | H12 |
| s_low | H21=0 | H22 |

FIG. 10

ON-THE-FLY SCALING FACTOR CHANGE FOR IRREGULAR LDPC CODES

BACKGROUND

1. Field

The present invention relates to the scaling of irregular low density parity check (LDPC) codes.

2. Description of the Related Art

The computer environment paradigm has shifted to ubiquitous to computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices. Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device specific, and in most cases, can be updated. The two main types of flash memory components are named after the NAND and NOR logic gates. The individual flash memory cells exhibit internal characteristics similar to those of their corresponding gates. The NAND-type flash memory may be written and read in blocks (or pages) which are generally much smaller than the entire memory space. The NOR-type flash allows a single machine word (byte) to be written to an erased location or read independently. The NAND-type operates primarily in memory cards, USB flash drives, solid-state drives, and similar products, for general storage and transfer of data.

As described in U.S. Pat. No. 10,700,706 (the entire contents of which are incorporated herein by reference), NAND flash-based storage devices have been widely adopted because of their faster read/write performance, lower power consumption, and shock proof features. In general, however, they are more expensive compared to hard disk drives (HDD). To bring costs down, NAND flash manufacturers have been pushing the limits of their fabrication processes towards 20 nm and lower, which often leads to a shorter usable lifespan and a decrease in data reliability. As such, a more powerful error correction code (ECC) is required over traditional Bose-Chaudhuri-Hocquenghem (BCH) codes to overcome the associated noises and interferences, and thus improve the data integrity. One such ECC is a low-density parity-check (LDPC) code.

There are different iterative decoding algorithms for LDPC codes and associated decoders, such as bit-flipping (BF) decoding algorithms, belief-propagation (BP) decoding algorithms, sum-product (SP) decoding algorithms, min-sum (MS) decoding algorithms, Min-Max decoding algorithms, etc. Multiple decoding algorithms may be used in a particular system to permit different codewords to be decoded using different decoders depending on conditions such as noise level and interference. As described in U.S. Pat. No. 7,337,384 (the entire contents of which are incorporated herein by reference), prior methods and devices have used checksum-based error processing to provide unequal error detection (UED) for error tolerant applications.

As described in U.S. Pat. No. 11,184,024 (the entire contents of which are incorporated herein by reference), an LDPC code can be characterized by an M×N parity-check matrix H, the column weight of the i-th ($0 \le i < N$) column of H is the number of non-zero entries in the i-th column of the parity-check matrix H. If column weights of all columns of H are the same, the LDPC code represented by H is called a regular LDPC code. Otherwise, the LDPC code is called an irregular LDPC code. In other words, columns of the parity-check matrix H of an irregular LDPC code have different column weights.

Irregular LDPC codes are characterized by a very sparse parity-check matrix H in which the column weight may vary from column to column and the row weight may vary from row to row. The ability to allocate the column and row weights flexibly provides a useful design freedom. In fact, properly designed irregular LDPC codes tend to outperform regular LDPC codes for large block lengths; gains of up to 0.5 dB can be obtained.

Due to their flexibility and improved decoding performance, irregular LDPC codes are increasingly being used in a non-volatile memory system (e.g., a NAND flash memory) to ensure robust data storage and access.

In this context, embodiments of the present invention arise.

SUMMARY

Aspects of the invention include a decoding method. In accordance with an embodiment of the invention, the decoding method may include decoding data and estimating a weighted checksum on the decoded data to determine whether the decoding is successful. The weighted checksum is calculated based on a first group and a second group, the first group is associated with weights for high degree nodes of an irregular parity check matrix, and the second group is associated with weights for low degree nodes of the irregular parity check matrix.

Further aspects of the invention include a memory system. In accordance with an embodiment of the present invention, the memory system may include a storage and a decoder in which the decoder is configured to decode data and estimate a weighted checksum on the decoded data to determine whether the decoding is successful. The weighted checksum is calculated based on a first group and a second group, the first group is associated with weights for high degree nodes of an irregular parity check matrix, and the second group is associated with weights for low degree nodes of the irregular parity check matrix.

Additional aspects of the invention include a memory controller. In accordance with an embodiment of the present invention, the memory controller may include a receiver for receiving data and a decoder.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In one embodiment of the present invention, as detailed below, an inventive method imposes constraints on the construction of a parity check matrix which facilitates error correction for irregular LDPC codes. The constraints segment the irregular LDPC matric into regions with different weights, for example into one of more regions having high density modes (regions with high column weights) and into one or more regions with mid-low density modes (regions with column weights lower than the high density modes).

In still another embodiment of the present invention, the inventive decoding method estimates the number of remaining errors after decoding using a) weights for high degree nodes (high column weight) of the irregular parity check matrix and b) weights for low degree nodes (low column weight) of an irregular parity check matrix.

In still another embodiment of the present invention, the inventive decoding method applies scaling factors to decoders using the algorithms noted above (LDPC decoding, BF decoding, BP decoding, SP decoding, MS decoding, Min-Max decoding, etc.) where the scaling factors are based on the weights of both the low degree nodes and the high degree nodes.

Figure 1:
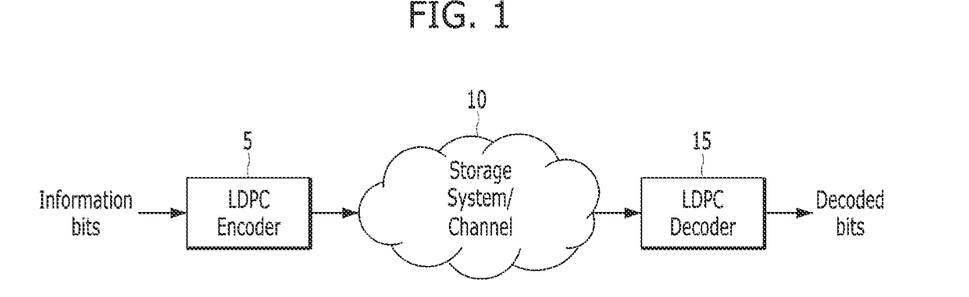
FIG. 1 is a high level block diagram illustrating an error correcting system in accordance with embodiments of the present invention.

FIG. 1 is a high level block diagram illustrating an error correcting system, in accordance with embodiments of the present invention. In the example shown, the error correcting system may include an encoder and a decoder using LDPC coding and decoding algorithms, That is, the error correcting system may include a LDPC encoder 5 and a LDPC decoder 15.

The LDPC encoder 5 may receive information bits including data which is desired to be stored in a storage system (or a memory system) 10. The LDPC encoder 5 may encode the information bits to output LDPC encoded data. The LDPC encoded data from the LDPC encoder 5 may be written to a storage device or memory device of the storage system 10. In various embodiments, the storage device may include a variety of storage types or media. In some embodiments, during being written to or read from the storage device, data is transmitted and received over a wired and/or wireless channel. In this case, the errors in the received codeword may be introduced during transmission of the codeword.

When the stored data in the storage system 10 is requested or otherwise desired (e.g., by an application or user which stored the data), the LDPC decoder 15 may perform LDPC decoding data received from the storage system 10, which may include some noise or errors. In various embodiments, the LDPC decoder 15 may perform LDPC decoding using the decision and/or reliability information for the received data. The decoded bits generated by the LDPC decoder 15 are transmitted to the appropriate entity (e.g., the user or application which requested it). With proper encoding and decoding, the information bits match the decoded bits.

Figure 2:
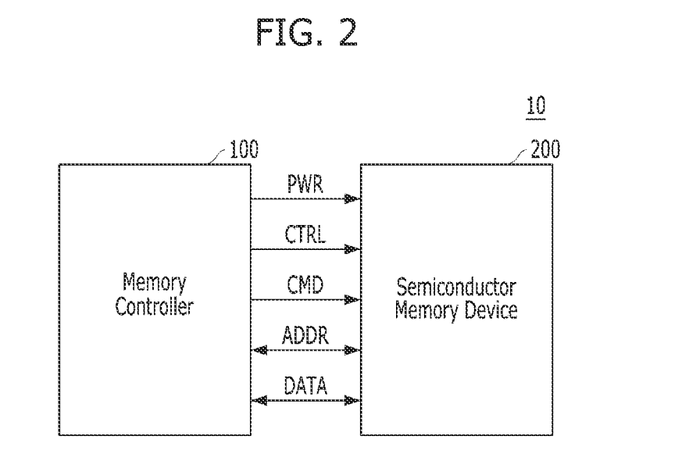
FIG. 2 is a block diagram schematically illustrating a memory system in accordance with embodiments of the present invention.

FIG. 2 is a block diagram schematically illustrating a memory system 10 in accordance with an embodiment of the present invention.

Referring FIG. 2, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 3:
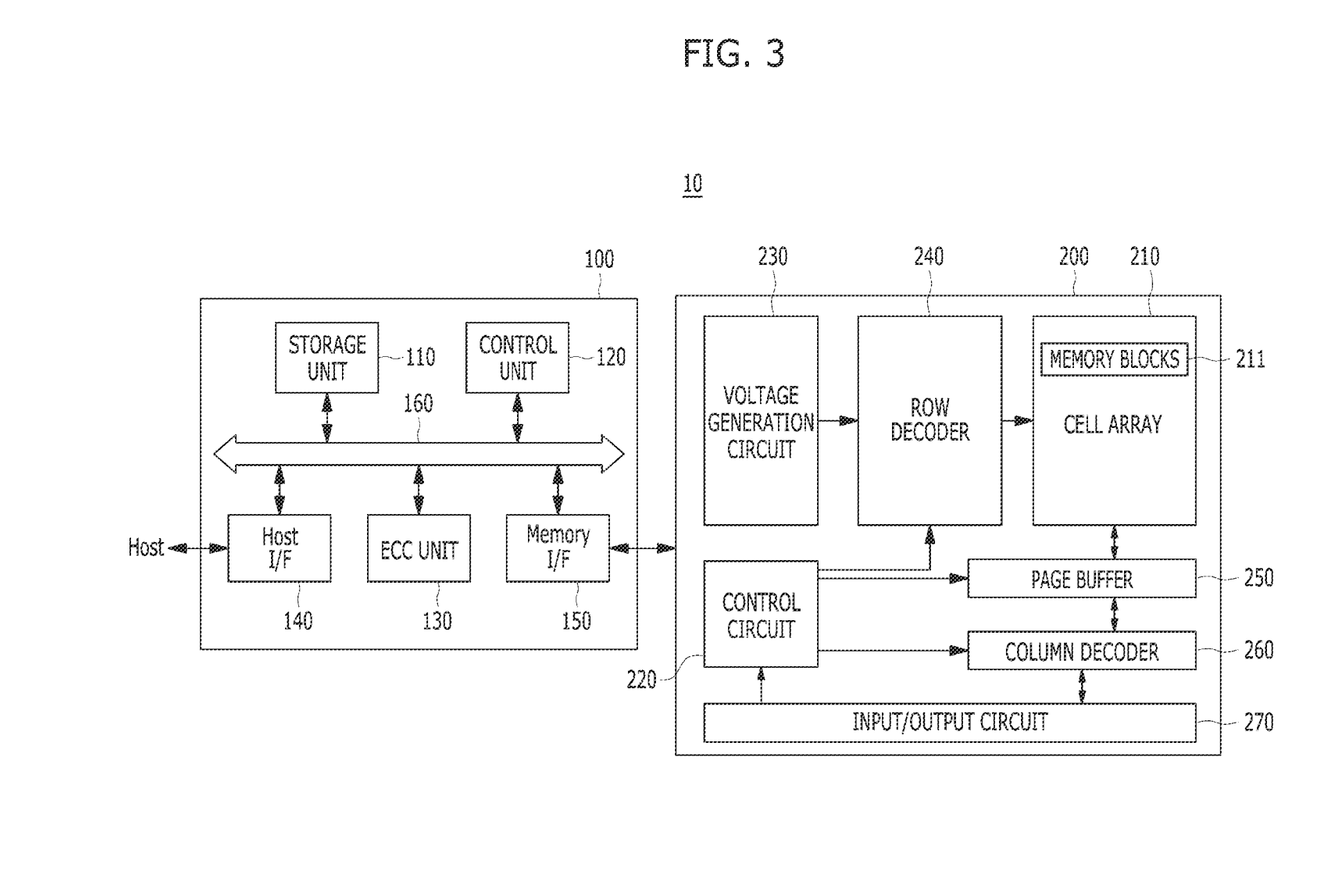
FIG. 3 is a block diagram illustrating a memory system in accordance with embodiments of the present invention.

FIG. 3 is a detailed block diagram illustrating a memory system in accordance with one embodiment of the present invention. For example, the memory system of FIG. 3 may depict the memory system 10 shown in FIG. 2.

Referring to FIG. 3, as shown in FIG. 2, the memory system 10 may include the memory controller 100 and the semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 lay be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, is a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

When using a low density parity check (LDPC) code, a bit-flipping (BF) decoder can decode LDPC codewords. The correction capability of a BF decoder limited, and its performance has an error floor. Relative to the BF decoder, a min-sum (MS) decoder has much higher correction capability and may be used for codewords that a BF decoder faded to decode. Nevertheless, in one embodiment of the present invention, the inventive decoding method uses either or both BF decoding and MS decoding.

As shown in FIG. 3, host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 may be connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 4:
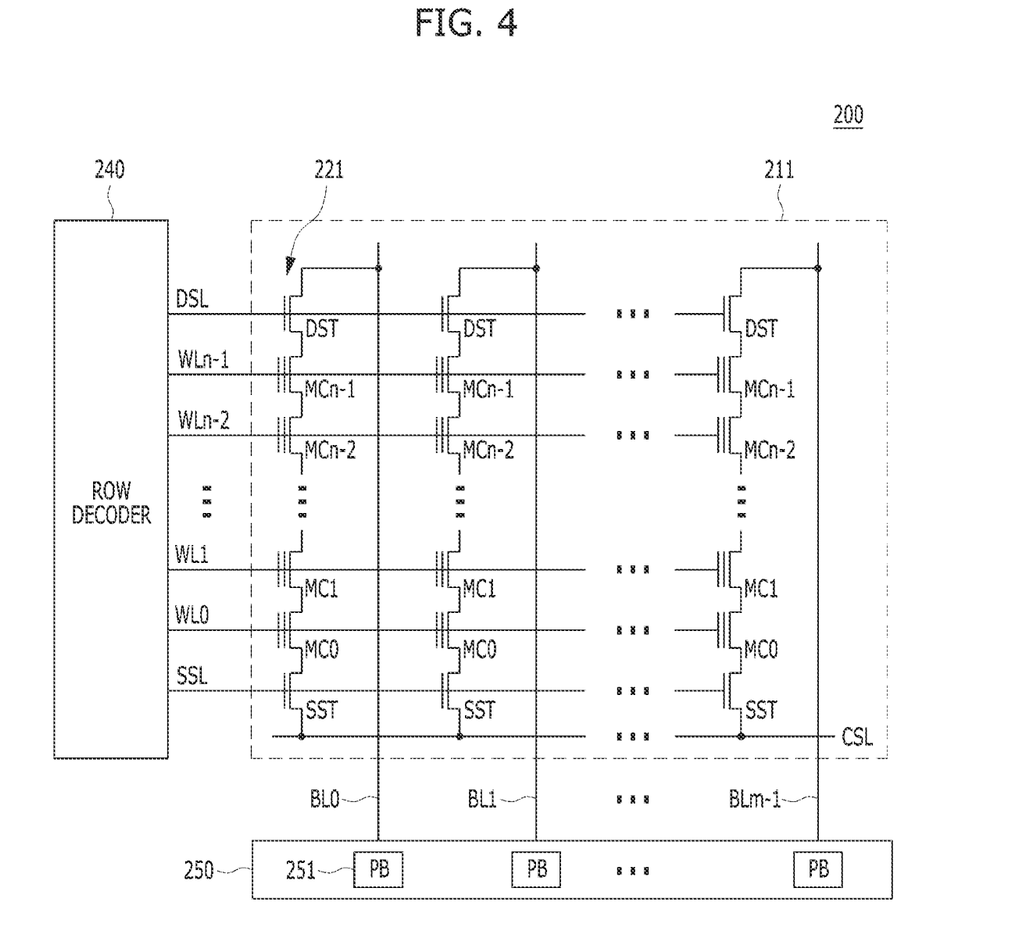
FIG. 4 is a circuit diagram illustrating a memory block of a memory device in accordance with embodiments of the present invention.

FIG. 4 is a circuit diagram illustrating a memory block of a semiconductor memory device in accordance with an embodiment of the present invention. For example, a memory block of FIG. 4 may be the memory blocks 211 of the memory cell array 210 shown in FIG. 3.

Referring to FIG. 4, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 5:
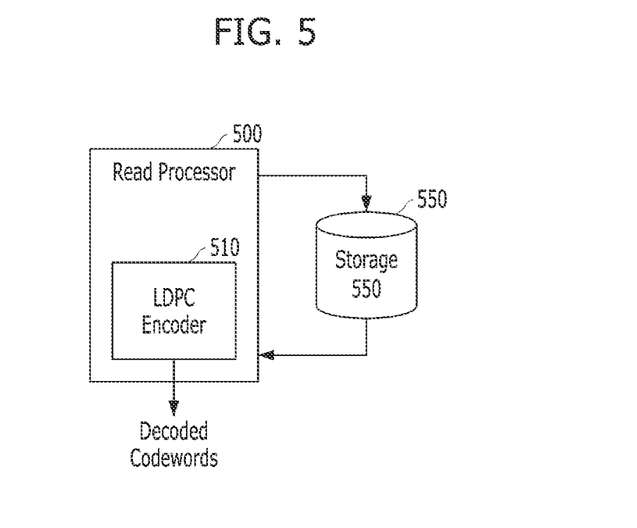
FIG. 5 is a diagram illustrating a storage system in accordance with embodiments of the present invention.

FIG. 5 is a diagram illustrating a storage system in accordance with embodiments of the present invention.

Referring to FIG. 5, the storage system may include a storage 550 and a memory controller as a read processor 500. The read processor 500 may perform a read operation for data stored in the storage 550. During the read operation, the read processor 500 may read data from the storage 500, which may include some noise or errors, and perform error correction for the read data. In some embodiments, the read processor 500 may include a decoder, for example, the LDPC decoder 510 may perform LDPC decoding. The read processor may also perform BF decoding and MS decoding. The read processor 500 may include a receiver (not shown) for receiving data from the storage 550.

When the stored data in the storage 550 is requested or otherwise desired (e.g., by an application or user which stored the data), the LDPC decoder 510 may receive data from the storage 550. The received data may include some noise or errors. The LDPC decoder 510 may perform detection on the received data and output decision and/or reliability information. The LDPC decoder 510 may include one of a soft detector and a hard detector. Either the soft detector or the hard detector can provide channel information for decoders, such as the LDPC decoder. For example, the soft detector may output reliability information and a decision for each detected bit. On the other hand, the hard detector may output a hard decision on each bit without providing corresponding reliability information. As an example, the hard detector may output as the hard decision that a particular bit is a "1" or a "0" without indicating how certain or sure the detector is in that decision. In contrast, the soft detector may output a decision and reliability information associated with the decision. In general, reliability information indicates how certain the detector is in a given decision. In one example, a soft detector may output a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

Also, LDPC decoder 510 may perform LDPC decoding using the decision and/or reliability information. LDPC decoder 510 may include one of a soft decoder and a hard decoder. The soft decoder utilizes both the decision and the reliability information to decode the codeword. The hard decoder utilizes only the decision values to decode the codeword. The decoded bits generated by the LDPC decoder 510 are transmitted to the appropriate entity (e.g., the user or application which requested it). With proper encoding and decoding, the information bits match the decoded bits.

In various embodiments, the system shown in FIG. 5 may be implemented using a variety of techniques including an application-specific integrated circuit (ASIC), a field-programmable gate array (FPGA), and/or a general purpose processor (e.g., an Advanced RISC Machine (ARM) core).

LDPC codes may be represented by bipartite graphs. One set of nodes (e.g., the variable or bit nodes) may correspond to elements of the codeword, and the other set of nodes (e.g., check nodes) may correspond to the set of parity check constraints satisfied by the code words. Typically, the edge connections in bipartite graphs are chosen at random.

Figure 6:
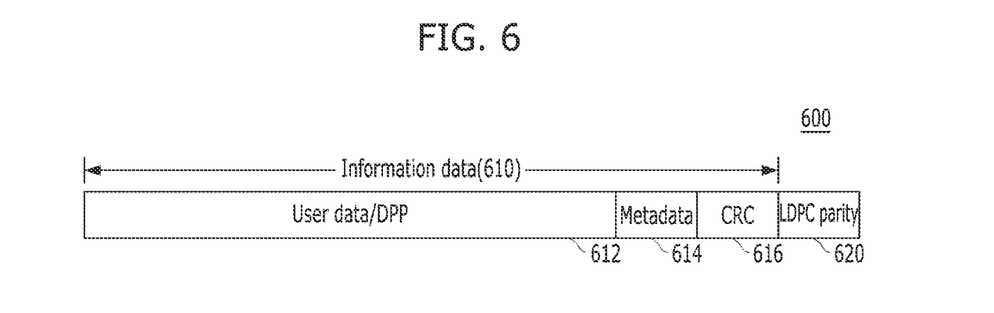
FIG. 6 is a diagram illustrating a format of a codeword to be stored in a storage system in accordance with embodiments of the present invention.

FIG. 6 is a diagram illustrating a format of a codeword 600 to be stored in a storage system. Referring to FIG. 6, the codeword 600 may include information data 610 and parity 620. In some embodiments, the codeword 600 may be generated by low-density parity-check (LDPC) codes. In other words, the information data 610 may be protected by LDPC codes, and the parity 620 may be LDPC parity, The information data 610 may include user data with data path protection (DPP) 612, meta-data 614 and cyclic redundancy check (CRC) parity bits 616. A CRC code which is an error-detecting code commonly used in digital networks and storage devices may detect accidental changes to raw data.

In a typical LDPC decoder, if the LDPC checksum is zero, the decoder may be terminated. The CRC parity bits 616 will be computed based on the decoded user data 612 and meta-data 614 after the LDPC decoding. If the computed CRC parity bits match the decoded CRC parity bits, decoding may be successful. Otherwise, a mis-correction may be declared.

In some embodiments of the present invention, it is supposed that $x=[x_0, x_1, \ldots, x_{N-1}]$ is a bit vector, and $H=[h_{i,j}]$ is an M×N low-density parity-check matrix with a binary value $h_{i,j}$ at the intersection of row i and column j. Then each row of H provides a parity check for x. If x is a codeword of H, it has $xH^T=0$.

Figure 7A:
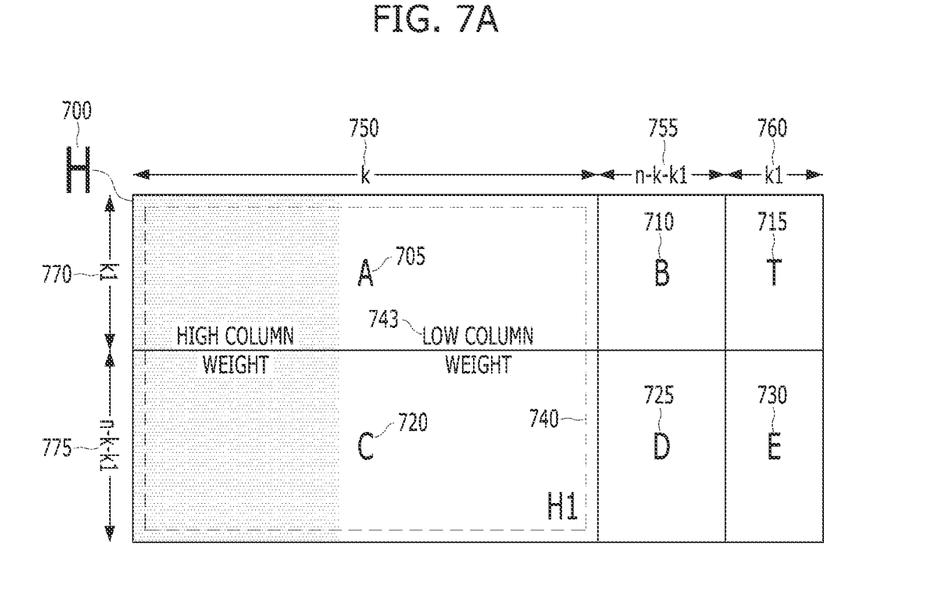
FIG. 7A is a depiction of an irregular low density parity check matrix.

FIG. 7A is a depiction of example an irregular parity check matrix H having different column weights in different regions. Parity check matrix H 700 shown in FIG. 7A includes six portions A 705, B 710, T 715, C 720, D 725, and E 730. The six portion format may be generated using the Richardson-Urbanke ("RU") algorithm, as is known in the art. In FIG. 7A, the A portion 705 and the C portion 720 have a width 750 of k, where k is the size of the information bits of the data to be encoded. Also in the illustrated parity check matrix H 700, the T portion 715 and the E portion 730 have a width 760 of k1, where k1 is the size of the T portion 715, which may be an identity matrix, as described below. B portion 710 and D portion 725 have a width 255 of n–k–k1, where n is the size of the total codeword ct including information bits and parity bits. A portion 705, B portion 710, and T portion 715 have height 770 of k1, in FIG. 7A. C portion 720, D portion 725, and E portion 730 have a height 275 of n–k–k1. The parity check matrix H 700 shown in FIG. 7A is only illustrative, and other irregular parity check matrices may be used in the present invention.

Since H 700 is an irregular parity-check matrix, circulant permutation can be performed to make portion T 715 an identity matrix and reduce the size of the dense matrix D. Within the characteristic of column weight not being uniform for irregular parity-check matrices, portion T 715 can be further enlarged (as compared to a regular parity-check matrix) to reduce the number of cycles of dense matrix calculation.

If it is assumed that x is transmitted over a noisy channel, then there may be a corrupted channel output is $y=[y_0, y_1, \ldots, y_{N-1}]$ with its hard decision being $z=[z_0, z_1, \ldots, z_{N-1}]$. The syndrome of z may be a binary vector calculated by $s=[s_0, s_1, \ldots, s_{N-1}]=zH^T$, where a weight of $\|s\|=\Sigma_{i=0}^{M-1} s_i$ represents the number of unsatisfied check nodes and is also referred to herein as the checksum. Let $z^{(j)}=[z_0, z_1, \ldots z_{N-1}]$ represent the hard decision of the j-th iteration with the syndrome vector of the j-th iteration represented as $s^{(j)}=[s_0^{(j)}, s_1^{(j)}, \ldots, s_{N-1}^{(j)}]=z^{(j)}H^T$. Then $\|s\|^{(j)}$ is referred to herein as the checksum of the j-th iteration.

Each iteration may include for example a process of transmitting V2C messages from the variable nodes to the check nodes, a process of updating values of the check nodes, a process of transmitting C2V messages from the check nodes to the variable nodes, and a process of updating values of the variable nodes. When a column-layered scheme is used, a first iteration may include a process of transmitting V2C messages from the variable nodes to the check nodes and a process of updating values of the check nodes. An initial LLR value of each of the variable nodes can be transferred to a check node connected to the corresponding variable node.

In each iteration, the values of the variable nodes may be updated, based on C2V messages received from the check nodes. In some embodiments, the updating of values of the variable nodes may include calculating APPs (A Posterior Probabilities) of the variable nodes and determining hard decision values of the variable nodes based on the calculated APPs. For example, a scaled min-sum (MS) algorithm can be used to calculate APPs of variable nodes corresponding to the i-th iteration. When APP has a negative value, the hard decision value of the variable node n may be determined as '1.' When APP is not a negative value, the hard decision value of the variable node n may be determined as '0.'

Generally, an irregular LDPC code is superior in performance to a regular LDPC code. However, the scaling in a MS decoder can only to be applied at late stage of decoding when the number of remaining errors is small. While this may work sufficiently well for regular LDPC codes (as the checksum is a good indicator of the number of remaining errors) for irregular LDPC codes, due to irregular (high, median and low) connectivity in different weights of the variable nodes, any correlation between the checksum representing the number of unsatisfied check nodes and the number of remaining errors may become weak.

In the case of an irregular LDPC code, even with a small number of errors remaining in high degree variable nodes, the checksum may be large. This makes alpha-beta scaling difficult to be applied to irregular LDPC codes and hence can cause a high error floor. In general, alpha-beta scaling provides an approach where different weighting factors are applied at different iterations. A weight-factor, w, can be a relatively small number at the beginning of the iterations which gradually increases with each subsequent iteration. By way of example, in an eight-iteration calculation, w, may be defined for each iteration as {0.125, 0.25, 0.5, 0.75, 0.75, 0.75, 0.75, 0.75}. Such a variable-weight-based alpha-beta approach can provide convergence on the corrected codeword.

In one embodiment of the present invention, as detailed below an inventive method may apply alpha-beta scaling to irregular LDPC codes and thereby can reduce the error floor.

In a MS decoder, a scaling factor is often applied to help the MS decoder converge at late stages of the iterations. A typical scaling factor scheme utilizes an estimator to estimate the number of remaining errors. The syndrome weight (or the checksum) is often used as such an indicator in regular LDPC codes. However, the present invention recognizes that the checksum does not often correlate well with the number of remaining errors for irregular LDPC codes due to the irregularity of the variable nodes' degrees. In one embodiment of the present invention, an inventive estimator (or indicator) of the number of remaining errors is provided, which works for irregular LDPC codes. With the inventive estimator, there is provided (in one embodiment) a method for applying differently weighted scaling factors to the irregular LDPC codes to compensate for the irregular column weight balance, and thereby improve convergence in determining the number of remaining errors for irregular LDPC codes.

As noted above, the checksum of an LDPC code can be written as s=c'*H, where c' (or $z^{(j)} = [z_0, \ldots z_{N-1}]$) as denoted above) is a current hard decision and H is the parity check matrix.

Figure 7B:
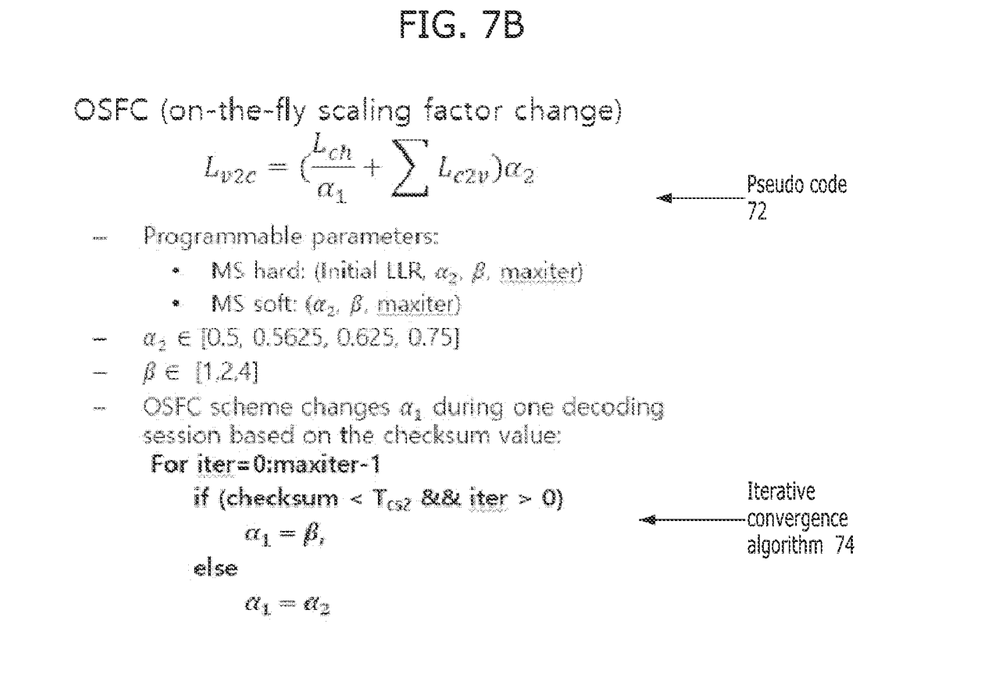
FIG. 7B is a depiction of the on-the-fly scaling factor change according to one embodiment of the present invention

In one embodiment of the present invention, an on-the-fly scaling factor change is applied to the $L_{v2c}$ message values as shown in the FIG. 7B. FIG. 7B shows the pseudo-code 72 for on-the-fly scaling factor change (OSFC) method of the present invention. In FIG. 7B, $L_{v2c}$ is the value of messages provided to the variable nodes indicating for example LLR (log-likelihood ratio). Accordingly, the values in pseudo-code 72 for the messages v2c are denoted as Lv2c, and the values in pseudo-code 72 for the messages C2V are denoted as Lc2v. As shown in FIG. 7B, $L_{v2c}$ is a summation where an initial (and scaled by $\alpha_1$) value of LLR (Lch/$\alpha_1$) is summed with subsequent values of messages C2V (from the check nodes to the variable nodes). As shown in FIG. 7B, the resultant is scaled by factor $\alpha_2$. In FIG. 7B, maxiter is the maximum number of iterations, and β is the finalized scale factor at the end of the iterations.

As shown in FIG. 7B, the on-the-fly scaling factor change (OSFC) method involves an iterative convergence algorithm 74. The iterations proceed a number of times up to maxiter−1 times by changing the scaling factor $\alpha_1$ during one session (that is during one iteration) based on the calculated checksum value and continues the iterations up to maxiter or until the checksum is below an acceptable threshold $T_{cS2}$. In that case, $\alpha_1$ is set to β, otherwise $\alpha_1$ is set to $\alpha_2$.

Figure 8:
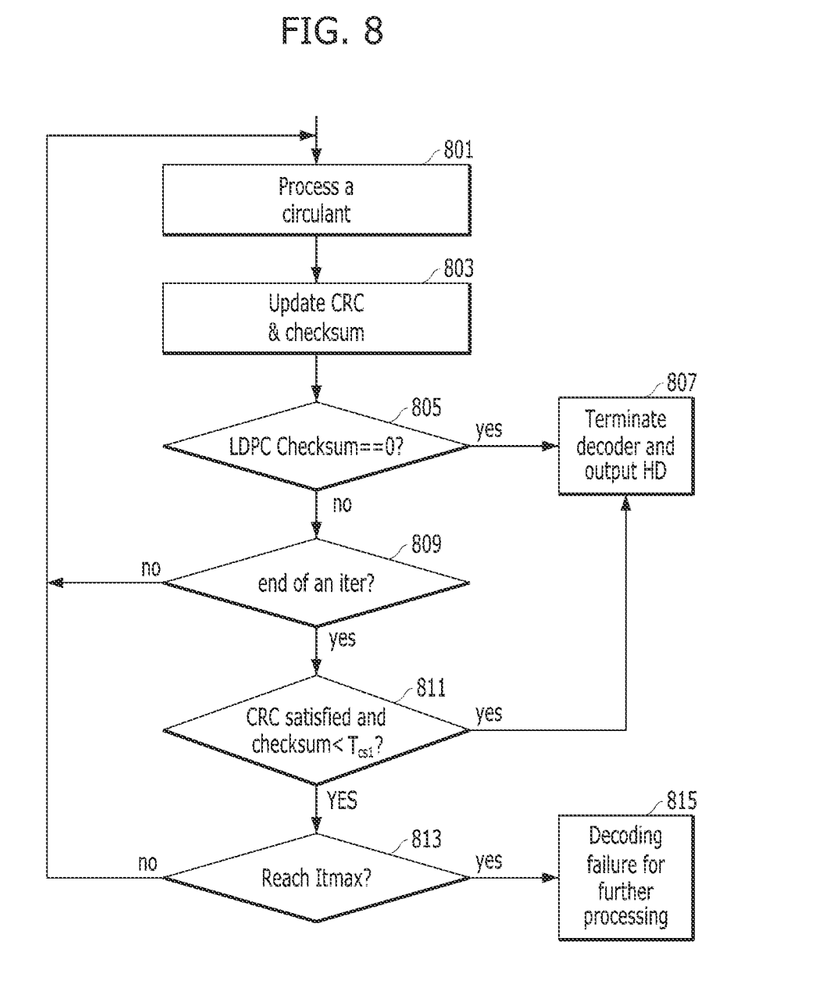
FIG. 8 is a flow chart illustrating the on-the-fly scaling factor process in accordance with embodiments of the present invention.

FIG. 8 is a flow chart for the on-the-fly error detection and termination. At 801, a circulant from the irregular low density parity check matrix H is processed based on the initial scale factors (or later updated scale factors). At 803, the CRC and LPDC checksum are updated. At 805, if the LPDC checksum is zero, the decoding is terminated at 807 and the successfully decoded word is output. At 805, if the LPDC checksum is not zero, the process proceeds to 809 where a decision for ending the iteration of the scaling factor. If no at 809, the process returns to 801 where circulant processing updates the scaling factor(s) for a new decoding session. If yes at 809, the process proceeds to 811 where the CRC and LPDC checksum are compared to a threshold $T_{cs1}$. If the threshold is met, the process proceeds to 807 where (as before) the successfully decoded word is output. If the threshold is not met at 811, the process then proceeds to 813 to see if a maximum number of iterations has been reached. If the maximum number has not been reached, the process returns to 801 where circulant processing updates the scaling factor(s) for a new decoding session. If the maximum number has been reached, the process proceeds to 915 and an error for decoding failure is generated.

Weighted Checksum as an Error Estimator

Figure 9:
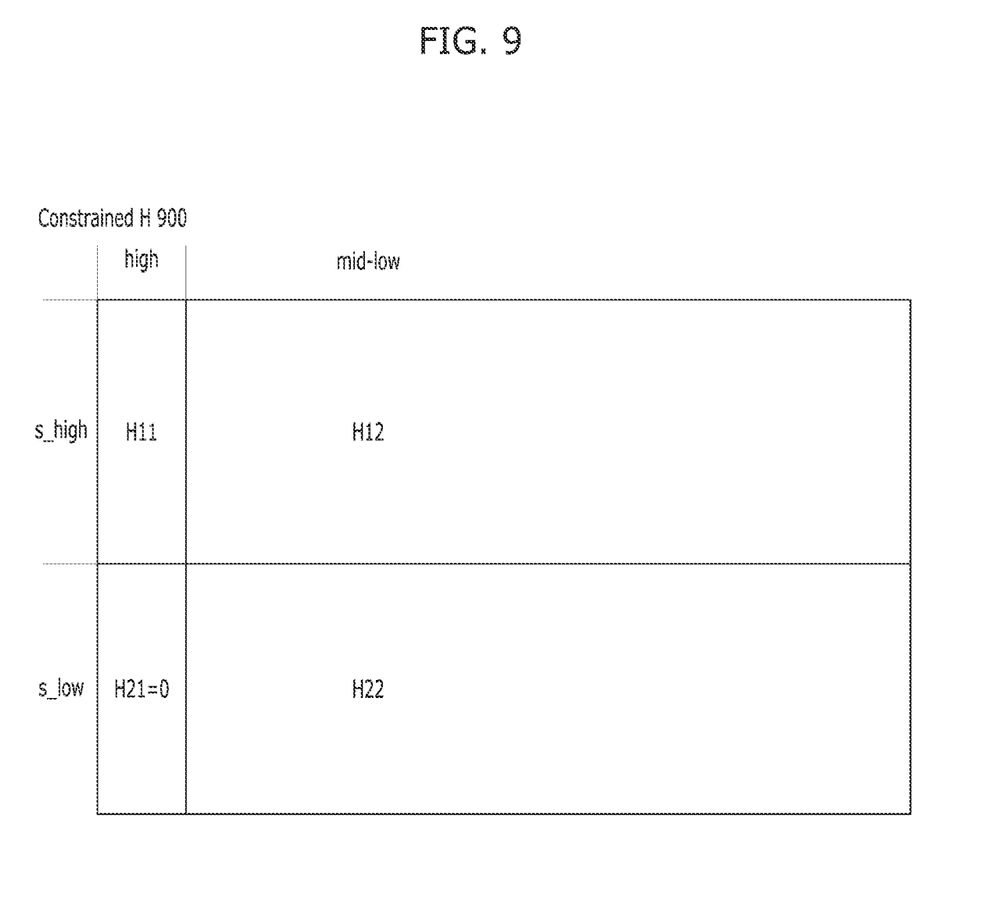
FIG. 9 is a constrained irregular low density parity check matrix in accordance with embodiments of the present invention.

In an irregular code, the checksum will not correlate well with the the number of remaining errors. In one embodiment of the present invention, a weighted checksum is used to estimate the remaining number of errors. In constructing the parity check matrix, a constraint is imposed such that the check nodes are partitioned into two sets. The first set is connected to high degree variable nodes (nodes which have a high column weight). The second set is connected to median and low degree variable nodes (nodes which have a mid-low column weight). The matrix structure is shown in FIG. 9. In FIG. 9, constrained matrix H 900 comprises circulant matrices H11, H12, H21, and H22. As shown in FIG. 9, circulant H21 is a null set.

The partial checksum s_high can be calculated as s_high=c(high)*H11 and s_low can be calculated as s_low=c(mid&low)*[H12, H22].

The weighted checksum can be calculated as s_weighted=w_h*s_high+w_l*s_low.

In one embodiment of the present invention, the weights w_h and w_l depend on the averages of the column weights of the high degree variable nodes and the median and low degree variable nodes. For example, if the average column weight of the high degree variable nodes is 10 and the average column weight of the median and low degree variable nodes is 4, then the respective weights are quantized by setting w_h=4 and w_low=10 (i.e., inter-exchanging the weight values) which balances out what would otherwise be an uneven contribution to the checksum due to the irregular LDPC matrix. In this type of alpha-beta scaling, the choice of w_h and w_l is not limited to the example above. In general, the weight values from one or more high degree regions are replaced with weight values representative of one or more regions with lower degrees (or columnweights), and the weight values from one or more low degree regions are replaced with weight values representative of one or more degree region with higher degrees (or column weights), thereby providing for a quantization level re-adjustment.

In one embodiment of the present invention, the OSFC algorithm and flow chart in FIGS. 7B and 8 operate with the checksum calculations described above, using the re-adjusted weights for the high degree nodes and the low degree nodes.

Generalization to Codes with Higher Irregularity

Depending on the irregularity of the variable node weight distribution, in one embodiment of the present invention, further partitioning of the check nodes into more sets can be made so that the irregular contribution(s) to the checksum from different weight groups can be better equalized.

Generalization to Bit-Flipping Decoder

Prior methods for improving decoding operations of an error correction device involved the steps of a) receiving a noisy codeword, the codeword having been generated for example from an irregular low-density parity-check (LDPC) code, b) performing a first iteration of a bit-flipping algorithm on the noisy codeword (with the bit-flipping algorithm passing a message between a plurality of variable nodes and a plurality of check nodes), c) computing a first syndrome based on an output codeword of the first iteration, flipping at least one bit of the output codeword, d) a second syndrome, and e) performing a subsequent iteration of the bit-flipping algorithm if the subsequent iteration is less than a maximum number of iterations.

In one embodiment of the present invention, the first and second syndromes may use, for the weights of $\|s\|$, the re-adjusted weighted checksums described above where the average column weights are used as an alpha-beta scaling. Hence, the number of remaining errors can be better estimated during the BF decoding than if the weighted checksums were not used. Accordingly, in one embodiment of the present invention, the re-adjusted weighted checksums described above replace conventional checksums in a BF decoder for better correction and a deeper error floor, permitting the BF decoder to determine better flipping thresholds and error floor mitigation features.

Figure 10:
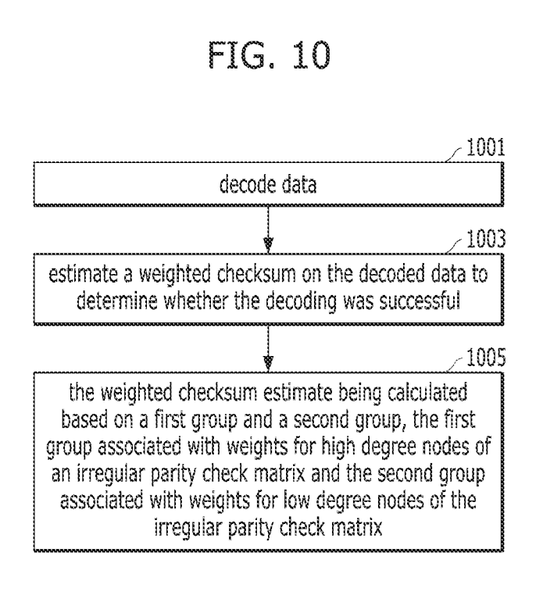
FIG. 10 is a flow chart illustrating a decoding method according to another embodiment of the present invention.

In one embodiment of the present invention there is provided a decoding method as depicted in FIG. 10. In this method at 1001, decode data. At 1003, estimate a weighted checksum on the decoded data to determine whether the decoding was successful. At 1005, the weighted checksum is calculated based on a first group and a second group, the first group associated with weights for high degree nodes of an irregular parity check matrix, and the second group associated weights (different than the weights for the high degree nodes) for low degree nodes of the parity check matrix. In this method, the weights for the high degree nodes may depend on an average column weight of the high degree nodes, and the weights for the low degree nodes may depend on an average column weight of the low degree nodes. In this method, the weights for the high degree nodes may be inter-exchanged with the weights for the loan degree nodes for estimation of the weighted checksum.

In various embodiments of this method, the irregular parity check matrix may comprise high degree regions with high column weights separated from low degree regions with low column weights lower than the high column weights. Further, the irregular parity check matrix may comprise a low density parity check matrix, and the method may further comprise determining a LDPC checksum in accordance with low density parity check LDPC decoding.

In this method, the LDPC decoding may be terminated if generated CRC parity bits match initial CRC bits and the LDPC checksum is less than a predetermined threshold. In this method, scaling values can be adjusted for each iteration of the LDPC decoding. In this method, on-the-fly processing of circulants in the parity check matrix may estimate a weighted checksum.

In this method, scaling factors based on the weights of both the low degree nodes and the high degree nodes can be applied to a mini-sum decoder decoding the irregular LDPC codes, In this method, a checksum in a bit-flop BF decoder can be replaced with the estimated weighted checksum based on the weights for the high degree nodes and the weights for the low degree nodes.

In another embodiment of the present invention, there is provided a memory system (such as in FIG. 3) having a storage (such as for example memory cell array 210) and a decoder (such as for example control circuit 220) coupled to the storage. The decoder is configured to decode data and estimate a weighted checksum on the decoded data to determine whether the decoding is successful. The weighted checksum is calculated based on a first group and a second group, the first group associated with weights for high degree nodes of an irregular parity check matrix, and the second group associated weights (different than the weights for high degree nodes) for low degree nodes of the parity check matrix.

In this memory system, the weights for the high degree nodes may depend on an average column weight of the high degree nodes, and the weights for the low degree nodes may depend on an average column weight of the low degree nodes. In this memory system, the weights for the high degree nodes may be inter-exchanged with the weights for the low degree nodes for estimation of the weighted checksum.

In various embodiments of this memory system, the irregular parity check matrix may comprise high degree regions with high column weights separated from low degree regions with low column weights lower than the high column weights. Further, the irregular parity check matrix may comprise a low density parity check matrix, and the method may further comprise determining a LDPC checksum in accordance with low density parity check LDPC decoding.

In this memory system, the LDPC decoding may be terminated if generated CRC parity bits match initial CRC bits and the LDPC checksum is less than a predetermined threshold. The decoder may be configured to adjust scaling values for each iteration of the LDPC decoding. The decoder may be configured to perform on-the-fly processing of circulants in the parity check matrix to estimate a weighted checksum.

In this memory system, the decoder may be configured to apply scaling factors based on the weights of both the low degree nodes and the high degree nodes to a mini-sum decoder decoding the irregular LDPC codes. The decoder may be configured to replace a checksum in a bit-flop BF decoder with the estimated weighted checksum based on the weights for the high degree nodes and the weights for the low degree nodes.

Although the foregoing embodiments have been described in some detail for purposes of clarity of understanding, the invention is not limited to the details provided. There are many alternative ways of implementing the invention. The disclosed embodiments are illustrative and not restrictive. The present invention is intended to embrace all modifications and alternatives of the disclosed embodiment. Furthermore, the disclosed embodiments may be combined to form additional embodiments.

Indeed, implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage is devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A decoding method comprising:
   decoding data; and
   estimating a weighted checksum on the decoded data to determine whether the decoding is successful,
   wherein
   the weighted checksum is calculated based on a first group and a second group,
   the first group is associated with weights for high degree nodes of an irregular parity check matrix, and
   the second group is associated with weights for low degree nodes of the irregular parity check matrix.

2. The method of claim 1, wherein
   the weights for the high degree nodes depend on an average column weight of the high degree nodes, and
   the weights for the low degree nodes depend on an average column weight of the low degree nodes.

3. The method of claim 2, wherein the weights for the high degree nodes are inter-exchanged with the weights for the low degree nodes for estimation of the weighted checksum.

4. The method of claim 1, wherein the irregular parity check matrix comprises high degree regions with high column weights separated from low degree regions with low column weights lower than the high column weights.

5. The method of claim 1, wherein
   the irregular parity check matrix comprises a low density parity check matrix, and
   the method further comprises determining a LDPC checksum in accordance with low density parity check LDPC decoding.

6. The method of claim 5, further comprising terminating the LDPC decoding if generated CRC parity bits match initial CRC bits and the LDPC checksum is less than a predetermined threshold.

7. The method of claim 5, further comprising adjusting scaling values for each iteration of the LDPC decoding.

8. The method of claim 1, wherein the estimating a weighted checksum comprises on-the-fly processing of circulants in the parity check matrix.

9. The method of claim 1, further co uprising applying scaling factors based on the weights of both the low degree nodes and the high degree nodes to a mini-sum decoder decoding the irregular LDPC codes.

10. The method of claim 1, further comprising replacing a checksum in a bit-flop BF decoder with the estimated weighted checksum based on the weights for the high degree nodes and the weights for the low degree nodes.

11. A memory system, comprising:
a storage; and
a decoder coupled to the storage and configured to:
decode data; and
estimate a weighted checksum on the decoded data to determine whether the decoding is successful,
wherein
the weighted checksum is calculated based on a first group and a second group,
the first group is associated with weights for high degree nodes of an irregular parity check matrix, and
the second group is associated with weights for low degree nodes of the irregular parity check matrix.

12. The memory system of claim 11, wherein
the weights for the high degree nodes depend on an average column weight of the high degree nodes, and
the weights for the low degree nodes depend on an average column weight of the low degree nodes.

13. The memory system of claim 11, wherein the weights for the high degree nodes are inter-exchanged with the weights for the low degree nodes for estimation of the weighted checksum.

14. The memory system of claim 11, wherein the irregular parity check matrix comprises high degree regions with high column weights separated from low degree regions with low column weights lower than the high column weights.

15. The memory system of claim 11, wherein
the parity check matrix comprises a low density parity check matrix, and
the decoder is configured to determine a LDPC checksum in accordance with low density parity check LDPC decoding.

16. The memory system of claim 15, wherein the decoder is configured to terminate the LDPC decoding if generated CRC parity bits match initial CRC bits and the LDPC checksum is less than a predetermined threshold.

17. The memory system of claim 15, wherein the decoder is configured to adjust scaling values for each iteration of the LDPC decoding.

18. The memory system of claim 11, wherein the decoder is configured to estimate the weighted checksum by on-the-fly processing of circulants in the parity check matrix.

19. The memory system of claim 11, wherein the decoder is configured to apply scaling factors based on the weights of both the low degree nodes and the high degree nodes to a mini-sum decoder decoding the irregular LDPC codes.

20. The memory system of claim 11, wherein the decoder is configured to replace a checksum in a bit-flop BF decoder with the estimated weighted checksum based on the weights for the high degree nodes and the weights for the low degree nodes.

* * * * *